United States Patent [19]
Pickett et al.

[11] Patent Number: 5,196,808
[45] Date of Patent: Mar. 23, 1993

[54] RF AMPLIFIER PROTECTOR AND METHOD

[75] Inventors: Michael N. Pickett, Phoenix; Gary P. English, Tempe, both of Ariz.

[73] Assignee: Motorola, Inc., Schaumburg, Ill.

[21] Appl. No.: 801,554

[22] Filed: Dec. 2, 1991

[51] Int. Cl.⁵ ............................................. H03F 1/52
[52] U.S. Cl. ................... 330/298; 330/207 P; 455/117
[58] Field of Search ................... 330/298, 207 P; 455/117, 126, 127

[56] References Cited

U.S. PATENT DOCUMENTS

| | | | |
|---|---|---|---|
| 3,852,669 | 12/1974 | Bowman et al. | 330/207 P |
| 3,969,683 | 7/1976 | Fabricius | 330/144 |
| 4,165,493 | 8/1979 | Harrington | 330/207 |
| 4,353,037 | 10/1982 | Miller | 330/298 |
| 4,485,349 | 11/1984 | Siegel et al. | 330/284 |
| 5,043,676 | 8/1991 | Sato et al. | 330/284 |

Primary Examiner—Robert J. Pascal
Assistant Examiner—Tan Dinh
Attorney, Agent, or Firm—Frank J. Bogacz

[57] ABSTRACT

An amplifier protector and method for preventing power overload of a power amplifier and destruction of transmission circuitry and printed wiring board. The protector continually monitors the peak forward and reflected voltages of the transmitter output which are proportional to the forward and reflected power. An associated processor determines whether the forward voltage is below a threshold voltage which indicates a circuit malfunction. If the circuit malfunction is detected, the processor via an automatic level control circuit turns off the power amplifier in a timely fashion to prevent damage to the transmission circuitry.

18 Claims, 3 Drawing Sheets

RF AMPLIFIER PROTECTOR AND METHOD

BACKGROUND OF THE INVENTION

The present invention pertains to RF (radio frequency) circuitry and more particularly detection of circuit failures and protection of RF amplifiers and the RF path due to overloading caused by circuit failure.

When circuitry associated with an RF power amplifier fails, such as PIN diode switches, harmonic filters or power sensors, the automatic level control (ALC) loop that controls the power amplifier output level becomes an open loop. The result of this type of component failure is that the power amplifier attempts to deliver maximum power output into the failed circuitry. One result of this failure may be that various components are damaged by the power overload. More extensive damage may result from damage to the printed circuit board on which the components are mounted. Printed circuit board damages are very expensive to repair or in some cases non-repairable.

In the open loop situation (when a malfunction occurs), the ALC demands maximum power. As a result, the components become thermally damaged.

It is highly desirable therefore to provide a RF power amplifier overload protector and method for monitoring the RF power output of a power amplifier of a transmitter and detecting a malfunction of this type and turning off the power amplifier.

SUMMARY OF THE INVENTION

In accordance with the present invention a novel RF amplifier protector and method is shown. An amplifier protection arrangement for coupling modulated signals to an antenna for transmission of these signals includes an amplifier for receiving the modulated signals and producing amplified signals. A power sensor determines the power of the amplified signals and provides first and second voltage indicators proportional to the power of the amplified signal. The power sensor is coupled to the amplifier and to the antenna. A controller adjusts the power of the amplified signals. The controller is coupled to the amplifier and to the power sensor. An amplifier protector turns off the amplifier via the controller, if the first and second voltage indicators show the power of the amplified signals being substantially below a threshold voltage. The amplifier protector is coupled to the power sensor and to the controller.

DESCRIPTION OF THE PREFERRED EMBODIMENT

Figure 1:
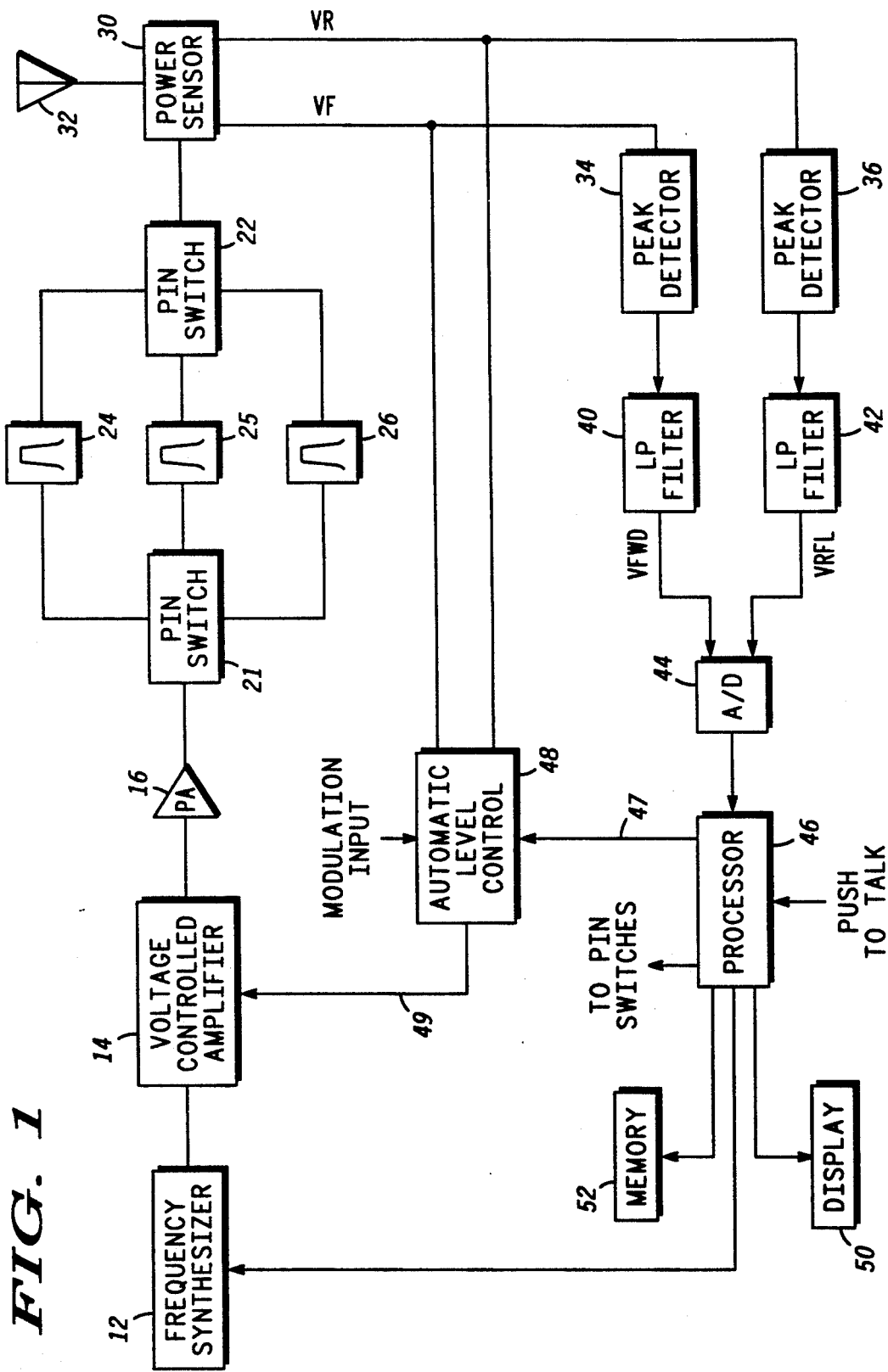
FIG. 1 is a block diagram of an RF power protector system in accordance with the present invention.

Referring to FIG. 1, a block diagram of a radio circuit 10 including a RF amplifier protector arrangement is shown. Frequency synthesizer 12 provides the output carrier waveform at the appropriate frequency. Frequency synthesizer 12 is connected to voltage controlled amplifier 14. The gain of voltage controlled amplifier 14 is adjusted by a DC voltage on the control lead 49 from the automatic level control (ALC) 48. Voltage controlled amplifier 14 is further connected to power amplifier 16. Power amplifier 16 boosts the output signal to a high level suitable for voice or data transmission. Power amplifier 16 is connected to PIN switches 21 and 22. These PIN switches control the selection of band pass filters 24, 25, 26 to attenuate harmonics before transmission of the output signal. Although three filters are shown more or fewer filters may be included in the radio. The proper filter is selected by means of PIN diode switches 21 and 22. The output of PIN switch 22 is connected to power sensor 30. Power sensor 30 includes a directional coupler and two diode detectors. The output of power sensor 30 is coupled to transmission antenna 32. Power sensor 30 also provides two outputs VF and VR which provide outputs relative to the forward and reflected power levels respectively of sensor 30.

Power sensor 30 is connected to automatic level control 48 via the VF and VR leads. Power sensor 30 is connected to peak detector 34 via the VF lead and to peak detector 36 via the VR lead. Peak detector 34 is connected to low pass filter 40. Peak detector 36 is connected to low pass filter 42. Low pass filters 40 and 42 are coupled through analog-to-digital converter 44 to processor 46. Processor 46 may be implemented using a microprocessor or various other types of processors. Processor 46 generates the necessary timing and read/write function required for proper operation of the amplifier protector arrangement.

Automatic level control 48 is coupled to voltage controlled amplifier 14 to form a feedback loop for adjusting the power output by the radio circuit 10. ALC 48 also has an input from the voice and data circuitry (not shown) for the AM modulation input. Automatic level control (ALC) 48 may include a loop filter, a voltage reference, and current drivers. ALC 48 controls the comparison and adjustment of the desired output versus feedback levels. The output power is controlled by a digital input signal from processor 46 on lead 47. The selected input level transmitted from processor 46 to ALC 48 is stored in the ALC for subsequent use. Processor 46 is also connected to frequency synthesizer 12.

Processor 46 is connected to PIN switches 21 and 22 to control the selection of the appropriate filter 24–26. Processor 46 is connected to display 50. Display provides for indication to an operator that a malfunction has occurred and that power amplifier 16 has been turned off. Processor 46 is connected to memory 52. Memory 52 includes prestored and calibration data associated with the various power levels for different modulation types for the power amplifier 16. Processor 46 has a PUSH-TO-TALK input which is generated when the operation keys the radio for transmission by external circuitry (not shown).

During normal operation, processor 46 selects the appropriate frequency and modulation type for frequency synthesizer 12; the band pass filter settings of PIN switches 21 and 22 for selecting filters 24–26 and the power output setting for ALC 48. Processor 46 sets the appropriate frequency and transmits this to frequency synthesizer 12. The band pass filter settings are transmitted to the PIN switches 21 and 22. The power output setting is transmitted from processor 46 to ALC 48 via lead 47. The closed loop operation of the ALC 48 compares the measured value of transmitted forward voltage VF of power sensor 30 to the power level transmitted to ALC 48 via processor 46. Based upon the result of this comparison, the ALC 48 adjusts the control signal on lead 49 to control the voltage controlled amplifier 14 to set the appropriate output level. As a result, power amplifier 16 is driven at a level which corresponds to the desired level indicated by the processor 46. Processor 46 continually samples, at a rate of 10 times per second (every 100 ms.), the forward (VFWD) and reflected (VRFL) power levels measured by peak detectors 34 and 36, respectively. The processor must sample at a fast enough rate in order to turn off the power amplifier rapidly enough to protect the circuit components and printed wiring board from thermal damage, if a circuit malfunction occurs. Processor 46 then determines from the previously mentioned settings a particular threshold level. Processor 46 then compares the threshold with the measured (VFWD) value. For a failure of one of the components in the power amplifier path, from power amplifier 16 to antenna 32, the value of VFWD will measure a lower value than acceptable. Processor 46 detects this as a fault condition and via ALC 48 and voltage controlled amplifier 14 turns off power amplifier 16, thereby protecting the circuitry and printed wiring board from excessive power and heat.

Figure 2:
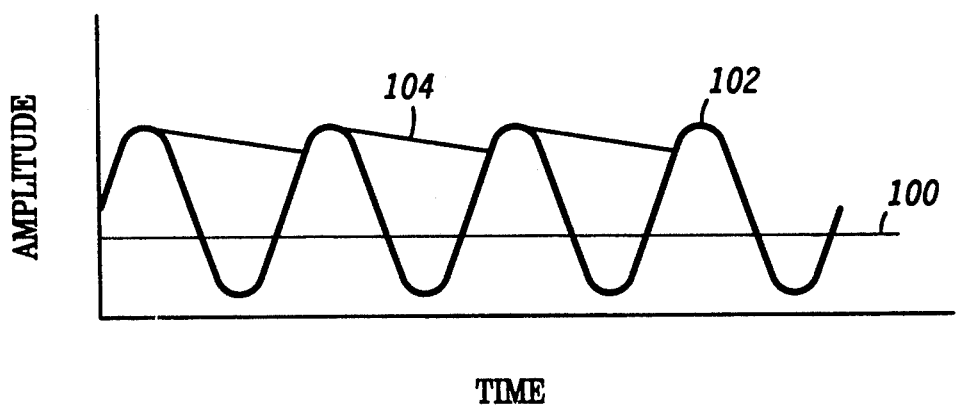
FIG. 2 is a waveform diagram of the output power of the protector system of FIG. 1.

The transmitted output may be either an AM or FM signal. As a result, the output of power sensor 30 must be held at peak for the AM case. The peak detectors 34 and 36 are transparent in the FM mode. The waveforms for the AM case are depicted in FIG. 2. The threshold value for the output signal is shown as waveform 100. The power sensor voltage is the sinusoidal voltage displayed as waveform 102. The peak detected and filtered voltage is shown as waveform 104. Charge and discharge times of the peak detectors 34 and 36 and low pass filters accommodate modulation rates for the AM case from approximately 30 Hz to 8 KHz. This discharge time for the peak detectors 34 and 36 and low pass filters 40 and 42 must allow the circuitry to hold the low frequency signal above threshold between cycles of the modulation rate. The charge time must be fast enough to track the peak values of the highest modulation rate. The threshold voltage is set according to measurements made at the time the radio is initially tuned and aligned. These measurements are stored in memory 52.

Figure 3:
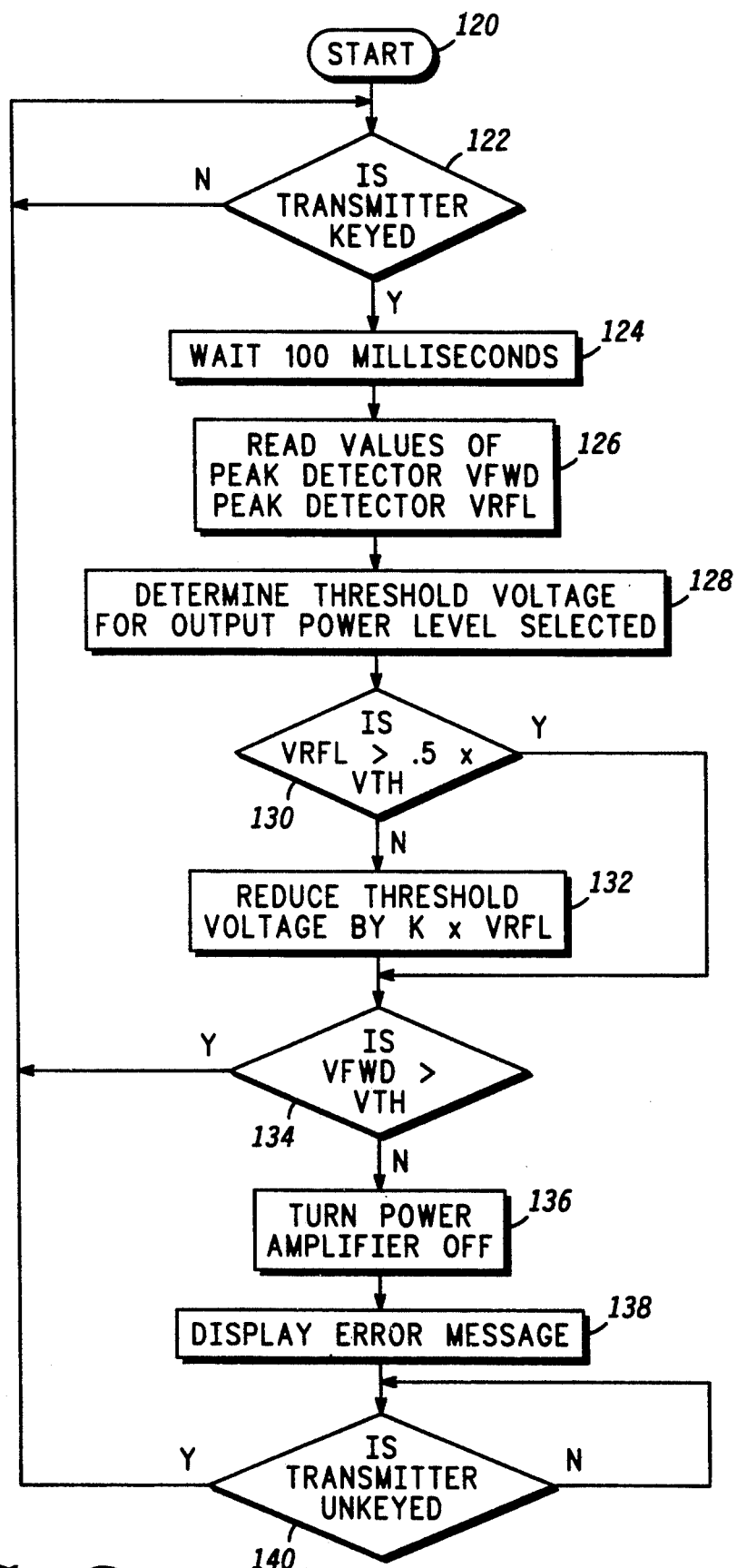
FIG. 3 is a flow chart of the overload monitoring method in accordance with the present invention.

FIG. 3 is a block diagram of the processor method for RF amplifier protection. When processor 46 is initiated it enters block 120 and constantly performs the following method. First, the processor 46 determines whether the transmitter function of the radio has been keyed. This is indicated to processor 46 by the PUSH-TO-TALK signal being sent. If the transmitter function has not been keyed, block 22 iterates the transmitter key test via the N path. If the transmitter has been keyed, block 122 transfers control to block 124 via the Y path. Block 124 waits a time of 100 milliseconds. This 100 millisecond wait allows sufficient time for malfunction detection without thermal damage to the components or printed wiring board. Next, processor 46 reads the values of the forward voltage (VFWD) from detector 34 and the reflective voltage (VRFL) from peak detector 36. Next, processor 46 determines the threshold voltage for the power output selected, block 128. The calculation of the threshold voltage is made as follows:

$$VTH = 0.4 \times VPOT - K \times VRFL$$

VPOT is an empirically determined voltage for each operating power output level for each radio. It is a function of the tolerances and the individual components selected. A set of VPOT values for each output power level selected are stored in memory 52 and read from memory 52 depending on whether low, medium or high power modes of transmission are selected in the AM or FM mode. Voltage values associated with the above mentioned power outputs are stored in memory 52 for both AM and FM cases. See Table 1 below which shows an example of the power output for each case. The actual voltage values stored may vary from radio to radio.

TABLE 1

| POWER OUTPUT MODE | MODULATION TYPE | |
|---|---|---|
|  | AM | FM |
| HIGH | 10 WATTS | 10 WATTS |
| MEDIUM | — | 5 WATTS |
| LOW | 5 WATTS | .1 WATTS |

In the preferred embodiment, 40% of the selected VPOT is determined by processor 46 to be VTH (the threshold voltage). Depending upon the accuracy required for the particular application of the protector circuit, other percentages of VPOT may be taken.

The reflected voltage VRFL read from peak detector 36 is multiplied by a constant K which is empirically determined. The constant K is also stored in memory 52 for each radio. Values of the constant K are typically equal approximately equal to one-fourth. If VRFL is less than or equal to a predetermined amount (0.5 × VTH) block 130, then the ALC reflected power circuit included in ALC 48 has not reduced the forward power output and control is transferred from block 130 to block 134. If VRFL is greater than (0.5 × VTH), then block 130 transfers control to block 132 which subtracts the constant (K × VRFL) from the threshold voltage (VTH). This adjusts the threshold for lower output power due to ALC reflected power circuit operation. Next, block 134 determines whether VFWD, the forward voltage, is greater than the threshold voltage VTH. If it is, the radio is properly operating and block 134 transfers control to block 122 via the Y path. Block 122 tests for the next transmission keying. If the forward voltage measured is less than or equal to the threshold voltage, a malfunction has been detected in the power amplifier path (from power amplifier 16 through power sensor 30). In this case, control is transferred from block 134 to block 136 via the N path. Processor 46 then through a command to ALC 48 causes voltage controlled amplifier 14 to turn off the signal to power amplifier 16, block 136. The processor 46 also issues a command to turn off the power amplifier 16. Processor 46 then displays an error indication upon display unit 50, block 138. This error indication may be, for example, a typed message on a CRT or teleprinter or a lighted lamp on a display panel, etc. Next block 140 determines whether the transmitter is unkeyed. That is a determination is made whether the PUSH-TO-TALK signal has been reset. If the transmitter is unkeyed, another transmission may be attempted and block 140 transfers control via the Y path to block 122. If the transmitter remains keyed, block 140 waits until the transmitter has been unkeyed.

As can be seen from the above explanation, a protector arrangement and method for preventing circuit overload and excessive power and heat from being applied to the power amplifier path and printed wiring board of a radio has been shown. The power amplifier protector constantly monitors the power output and rapidly turns off the power amplifier to prevent damage, if a circuit malfunction is detected.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An amplifier protector arrangement for coupling modulated signals to an antenna for transmission, said amplifier protector arrangement comprising:

amplifier means for receiving said modulated signals and amplifying said modulated signals to produce amplified signals;

power sensor means for determining the power of said amplified signals transmitted to said antenna and said power sensor means providing first and second voltage indicators proportional to said power of said amplified signals, said power sensor means coupled to said amplifier means and to said antenna;

control means for adjusting the power of said amplified signals, said control means coupled between said amplifier means and said power sensor means;

amplifier protection means for turning off said amplifier means, if said first and second voltage indicators show said power of said amplified signals being below a threshold voltage, said amplifier protector means coupled to said power sensor means and to said control means;

said amplifier protection means including:

detection means coupled to said power sensor means, said detection means operating in response to said first and second voltage indicators to provide corresponding forward and reflected voltage indicator; and analog-to-digital conversion means coupled to said detection means for converting said forward and reflected voltage indicators to digital form;

wherein said amplifier protection means further includes processor means connected to said analog-to-digital conversion means, said processor means for determining said threshold voltage from said digital form of said reflected voltage indicator, said processor means further operating to compare said digital form of said forward voltage indicator with said threshold voltage to produce a fault indicator, if said forward voltage indicator is greater than said threshold voltage.

2. An amplifier protector arrangement as claimed in claim 1, wherein said amplifier protector means includes:

first detector means coupled to said power sensor means, said first detector means operating in response to said first voltage indicator to provide said forward voltage indicator of said amplified signals; and second detector means coupled to said power sensor means, said second detector means operating in response to said second voltage indicator to provide said reflected voltage indicator of said amplified signals.

3. An amplifier protector arrangement as claimed in claim 2, wherein said amplifier protector means further includes:

first filter means connected to said first detector means, said first filter means for transmitting a limited range of frequencies of said forward voltage indicator;

second filter means connected to said second detector means, said second filter means for transmitting a limited range of frequencies of said reflected voltage indicator; and said analog-to-digital conversion means coupled to said first and second filter means, said analog-to-digital conversion means for converting said limited ranges of frequencies of said forward and reflected voltage indicators to digital form.

4. An amplifier protector arrangement as claimed in claim 1, wherein said amplifier protector means further includes said processor means being coupled to said control means, said processor means for transmitting said fault indicator to said control means; said control means responsive to said fault indicator by turning off said amplifier means; and said control means for receiving and transmitting said modulated signals to said amplifier means.

5. An amplifier protector arrangement as claimed in claim 4, wherein amplifier protector means further includes display means connected to said processor means, said display means for providing an operator with an indication of said fault indicator.

6. An amplifier protector arrangement as claimed in claim 5, wherein said amplifier protector means further includes memory means coupled to said processor means, said memory means for storing a plurality of parameters related to the power output of said amplified signals for a plurality of modulation types.

7. An amplifier protector arrangement as claimed in claim 4, wherein said amplifier means includes frequency synthesizer means coupled to said processor means, said frequency synthesizer means for providing a plurality of carrier frequencies.

8. An amplifier protector arrangement as claimed in claim 7, wherein said amplifier means further includes voltage controlled amplifier means coupled to said frequency synthesizer means and to said control means, said voltage controlled amplifier for producing output signals proportional to said modulated signals and to one of said plurality of said carrier frequencies.

9. An amplifier protector arrangement as claimed in claim 8, wherein said amplifier means further includes power amplifier means coupled to said voltage controlled amplifier means, said power amplifier means providing gain to said output signals and said one carrier frequency to produce said amplified signals.

10. An amplifier protector arrangement as claimed in claim 9, wherein said amplifier means further comprises:

a plurality of filter means; and switching means connected to said plurality of filter means, to said processor means, to said power amplifier means and to said power sensor means, said switching means operating in response to said processor means to select one of said plurality of filter means for coupling between said power amplifier means and said power sensor means.

11. In a radio including an amplifier, a power sensor, an antenna, an automatic level control, peak detectors, and a processor, an amplifier protection method comprising the steps of:

amplifying modulated signals and carrier frequency to produce an amplified signals;

detecting forward and reflected voltages related to the power of the amplified signals transmitted to the antenna;

determining whether the forward voltage is greater than a threshold voltage;

turning off the amplifier, if the forward voltage is less than or equal to the threshold voltage;

transmitting the amplified signals via the antenna, if the forward voltage is greater than the threshold voltage;

determining whether the radio is keyed to transmit; and iterating the step of determining whether the radio is keyed, if the radio is not keyed for transmission.

12. An amplifier protection method as claimed in claim 11, wherein there is further included the step of waiting a predetermined time, if the radio is keyed for transmission.

13. An amplifier protection method as claimed in claim 12, wherein said step of detecting includes the steps of:

reading by said processor from a first of said peak detectors coupled to the power sensor a value of the forward voltage of the amplified signals; and reading by said processor from a second of said peak detectors coupled to the power sensor a value of the reflected voltage of the amplified signals.

14. An amplifier protection method as claimed in claim 13, wherein said step of determining whether the forward voltage is greater than the threshold voltage includes the steps of:

first determining by the processor whether the transmission modulation type is AM or FM;

reading by the processor from a memory a stored voltage value related to the modulation type and to the power output required for transmission of the amplified signals; and second determining by the processor the threshold pt be a first constant multiplied by the stored voltage value.

15. An amplifier protection method as claimed in claim 14, wherein said step of determining whether the forward voltage is greater than the threshold voltage further includes the steps of:

third determining whether the reflected voltage is greater than one-half the threshold voltage;

reducing the threshold voltage by a second constant multiplied by the reflected voltage, if the reflected voltage is less than or equal to one-half the threshold voltage;

setting the threshold voltage equal to the reduced threshold voltage, if the reflected voltage is less than or equal to one-half the threshold voltage; and performing the step of determining whether the forward voltage is greater than the threshold voltage.

16. An amplifier protection method as claimed in claim 15, wherein the step of turning off the amplifier includes the step of displaying an error message indicating a malfunction of the amplifier on a display device of the radio.

17. An amplifier protection method as claimed in claim 16, wherein there is further included the steps of:

determining whether the radio is keyed for transmission, if the amplifier malfunction is detected;

iterating the step of determining whether the transmitter is keyed, if the transmitter remains keyed; and restarting the amplifier protection method, if the transmitter is not keyed for transmission.

18. A power amplifier protection method comprising the steps of:

amplifying a modulation input signal and carrier frequency to provide an output signal having appropriate gain for transmission;

reading by a processor values of a forward and reflected voltages of the output signal;

determining whether the forward voltage of the output signal is greater than a predetermined threshold voltage;

determining whether the reflected voltage of the output signal is greater than a predetermined threshold voltage multiplied by a constant; and turning off a power amplifier, if the determined forward and reflected voltages are less than or equal to the predetermined threshold voltage.

* * * * *